United States Patent
Han et al.

(10) Patent No.: US 10,290,562 B2
(45) Date of Patent: May 14, 2019

(54) APPARATUS AND METHOD FOR REDUCING ACOUSTICAL NOISE IN SYNTHETIC JETS

(71) Applicant: General Electric Company, Schenectady, NY (US)

(72) Inventors: Fei Han, Niskayuna, NY (US); Mehmet Arik, Uskudar Istanbul (TR); Trevor Wood, Niskayuna, NY (US); Charles Franklin Wolfe, Jr., Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 1315 days.

(21) Appl. No.: 14/060,262

(22) Filed: Oct. 22, 2013

(65) Prior Publication Data

US 2014/0124589 A1 May 8, 2014

Related U.S. Application Data

(62) Division of application No. 12/822,485, filed on Jun. 24, 2010, now Pat. No. 8,564,217.

(51) Int. Cl.
*H01L 23/467* (2006.01)
*F21V 29/63* (2015.01)
(Continued)

(52) U.S. Cl.
CPC .............. *H01L 23/467* (2013.01); *F21K 9/23* (2016.08); *F21V 29/63* (2015.01);
(Continued)

(58) Field of Classification Search
CPC ........... H01L 23/467; H01L 2924/0002; F21V 29/63; F21K 9/13; F21Y 2105/001; F21Y 2101/02
(Continued)

(56) References Cited

U.S. PATENT DOCUMENTS

| 5,448,645 A | 9/1995 | Guerci |
| 5,548,653 A | 8/1996 | Pla et al. |

(Continued)

FOREIGN PATENT DOCUMENTS

| WO | 2008103676 A1 | 8/2008 |
| WO | 2010004469 A1 | 1/2010 |

(Continued)

OTHER PUBLICATIONS

Search Report and Written Opinion from PCT Application No. PCT/US2011/040115 dated Feb. 7, 2012.
(Continued)

*Primary Examiner* — Darren W Gorman
*Assistant Examiner* — Qingzhang Zhou
(74) *Attorney, Agent, or Firm* — Ziolkowski Patent Solutions Group, SC; Jean K. Testa

(57) ABSTRACT

Apparatus and method are provided for reducing acoustical noise when cooling a device, such as a lamp system. The apparatus includes at least a set of a first synthetic jet and a second synthetic jet. The first and second synthetic jets are responsive to respective actuating signals having a phase difference (e.g., 180°) between one another chosen to reduce acoustic noise produced by the first and second synthetic jets when cooling the device.

30 Claims, 6 Drawing Sheets

(51) Int. Cl.
*F21K 9/23* (2016.01)
*F21Y 105/10* (2016.01)
*F21Y 115/10* (2016.01)

(52) U.S. Cl.
CPC ....... *F21Y 2105/10* (2016.08); *F21Y 2115/10* (2016.08); *H01L 2924/0002* (2013.01)

(58) Field of Classification Search
USPC .......................................................... 239/4
See application file for complete search history.

(56) References Cited

U.S. PATENT DOCUMENTS

| | | | |
|---|---|---|---|
| 7,688,583 B1 | 3/2010 | Arik et al. | |
| 8,240,885 B2 | 8/2012 | Miller | |
| 2004/0018086 A1 | 1/2004 | Borchers et al. | |
| 2005/0276053 A1 | 12/2005 | Nortrup et al. | |
| 2007/0119573 A1* | 5/2007 | Mahalingam | F28F 13/02 165/80.4 |
| 2007/0139938 A1 | 6/2007 | Petroski et al. | |
| 2008/0295997 A1* | 12/2008 | Heffington | F15D 1/009 165/84 |
| 2009/0109625 A1 | 4/2009 | Booth et al. | |
| 2009/0141065 A1 | 6/2009 | Darbin et al. | |
| 2009/0219686 A1* | 9/2009 | Ishikawa | F04F 7/00 361/692 |
| 2010/0039012 A1 | 2/2010 | Grimm | |
| 2010/0051242 A1* | 3/2010 | Arik | F15D 1/00 165/104.33 |
| 2010/0053891 A1* | 3/2010 | Arik | H01L 23/467 361/692 |
| 2010/0054973 A1 | 3/2010 | Arik et al. | |
| 2010/0090577 A1 | 4/2010 | Reed et al. | |
| 2011/0089830 A1* | 4/2011 | Pickard | F21K 9/135 315/32 |
| 2011/0204790 A1 | 8/2011 | Arik et al. | |

FOREIGN PATENT DOCUMENTS

| | | |
|---|---|---|
| WO | 2010010495 A1 | 1/2010 |
| WO | 2010035198 A1 | 4/2010 |

OTHER PUBLICATIONS

Invitation to Pay Additional Fees from corresponding PCT Application No. PCT/US2011/040115 dated Dec. 19, 2011.

* cited by examiner

APPARATUS AND METHOD FOR REDUCING ACOUSTICAL NOISE IN SYNTHETIC JETS

CROSS REFERENCE TO RELATED APPLICATION

The present application is a divisional of and claims priority to U.S. Non-Provisional application Ser. No. 12/822,485, filed Jun. 24, 2010, the disclosure of which is incorporated herein by reference.

FIELD

The present invention is generally related to synthetic jets and, more particularly, to apparatus and techniques for reducing acoustic noise generated due to synthetic jets.

BACKGROUND

It is known to form synthetic jets by periodic suction and ejection of fluid out of an orifice in a housing that defines an internal chamber in a synthetic jet ejector. A volume changing mechanism for periodically changing the volume within the internal chamber may include a flexible diaphragm constructed as a wall of the housing. The flexible diaphragm is typically actuated by a piezoelectric actuator or other appropriate means.

A control system may be utilized to create time-harmonic motion of the diaphragm. As the diaphragm moves inwardly with respect to the chamber, decreasing the chamber volume, fluid is ejected from the chamber through the orifice. As the fluid passes through the orifice, vortices of fluid are formed. These vortices move away from the edges of the orifice under their own self-induced velocity. As the diaphragm moves outwardly with respect to the chamber, increasing the chamber volume, ambient fluid is drawn from relatively large distances from the orifice into the chamber. Because the exiting vortices are already removed from the edges of the orifice, they are not affected by the ambient fluid being entrained into the chamber. Thus, as the vortices travel away from the orifice, they synthesize a jet of fluid, thus called a "synthetic jet," through entrainment of the ambient fluid.

A synthetic jet ejector (which may be referred throughout the disclosure as a "synthetic jet") may be used for thermal management in relatively tight spaces where heat-producing components (e.g., integrated circuit (IC) packages, discrete circuit components, solid state components, etc.) may be disposed and where space for conventional cooling means (e.g., cooling ducts, etc) may be unavailable. Example applications that may benefit from synthetic jets may include LED (light emitting diode) lighting systems. Other example applications may include compact mobile devices, such as cellular phones, pagers, two-way radios, cameras, and the like.

One known issue in connection with synthetic jets is that during operation they may produce relatively high-levels of acoustic noise. A synthetic jet typically has two natural frequencies at which the synthetic jet yields an optimum cooling performance. These natural frequencies include the structural resonant frequency and the acoustic resonance—the Helmholtz—frequency. The structural resonant frequency is caused at the natural frequency of the structure of the synthetic jet, which consists typically of the synthetic jet plates acting as a mass and the elastomeric wall acting as a spring. The Helmholtz frequency is characterized by the acoustic resonance of air mass in and out of the orifice of the synthetic jet. The effect is due to the air in the synthetic jet volume acting as a spring and may be accompanied by a loud tonal noise and a determined vibrational mode if the two modes are not separated from one another in the frequency domain. Thus, operation of a synthetic jet may result in an acoustically loud noise that could limit or preclude its use for certain applications. In view of the foregoing considerations, it would be desirable to provide apparatus and/or techniques useful for reducing acoustic noise in synthetic jets.

BRIEF DESCRIPTION

In one example embodiment thereof, aspects of the present invention are directed to apparatus for reducing acoustical noise when cooling a device with synthetic jets. The apparatus includes at least a set of a first synthetic jet and a second synthetic jet. The first and second synthetic jets are responsive to respective actuating signals having a phase difference between one another chosen to reduce acoustic noise produced by the first and second synthetic jets when cooling the device.

In another aspect thereof, a lamp system includes at least a set of a first synthetic jet and a second synthetic jet. A driver is arranged to supply respective actuating signals to the first and second synthetic jets. The respective actuating signals have a phase difference between one another chosen to reduce acoustic noise produced by the first and second synthetic jets. A heat sink is thermally coupled to at least a solid state component of the lamp system arranged to emit light. The first and second synthetic jets are arranged to induce a flow of fluid to cool the heat sink and thereby remove at least some thermal energy produced by the solid state component when the lamp system is in an operative condition.

In yet another aspect thereof, a method for reducing acoustical noise when cooling a device with synthetic jets comprises: arranging at least a first synthetic jet and a second synthetic jet to induce a flow of fluid for cooling the device; actuating the first and second synthetic jets with respective sinusoidal signals having a phase difference between one another and a common frequency value; and selecting the phase difference to reduce acoustic noise produced by the first and second synthetic jets when cooling the device.

DETAILED DESCRIPTION

In accordance with aspects of the present invention, structural and/or operational relationships are described herein, as may be useful for reducing acoustic noise in synthetic jets.

In the following detailed description, numerous specific details are set forth in order to provide a thorough understanding of various embodiments of the present invention. However, those skilled in the art will understand that embodiments of the present invention may be practiced without these specific details, that the present invention is not limited to the depicted embodiments, and that the present invention may be practiced in a variety of alternative embodiments. In other instances, well known methods, procedures, and components have not been described in detail.

Furthermore, various operations may be described as multiple discrete steps performed in a manner that is helpful for understanding embodiments of the present invention. However, the order of description should not be construed as to imply that these operations need be performed in the order they are presented, nor that they are even order dependent. Moreover, repeated usage of the phrase "in one embodiment" does not necessarily refer to the same embodiment, although it may. The terms "comprising", "including", "having", and the like, as used in the present application, are intended to be synonymous unless otherwise indicated.

The adjectives "top" and "bottom" may be used for ease of description, e.g., in reference to the drawings; however, use of such adjectives should not be construed as suggestive of spatial limitations. For example, in a practical embodiment, structural features and/or components of a given device may be arranged partly in one orientation and partly in another. To avoid linguistic constraints, the adjectives "first" and "second" may be used in lieu of the adjectives "top" and "bottom", although the terms "first" and "second" could also be used in an ordinal sense.

Aspects of the present invention will be described in the context of a LED (light emitting diode) lighting system. It will be appreciated, however, that such a description should be construed in an example sense and not in a limiting sense being that aspects of the present invention are not limited to LED lighting systems. It will be now appreciated by one skilled in the art that aspects of the present invention can be applied to any device or piece of equipment that makes use of two or more synthetic jets. Other example applications may include compact mobile devices, such as cellular phones, pagers, two-way radios, cameras and the like.

Figure 1:
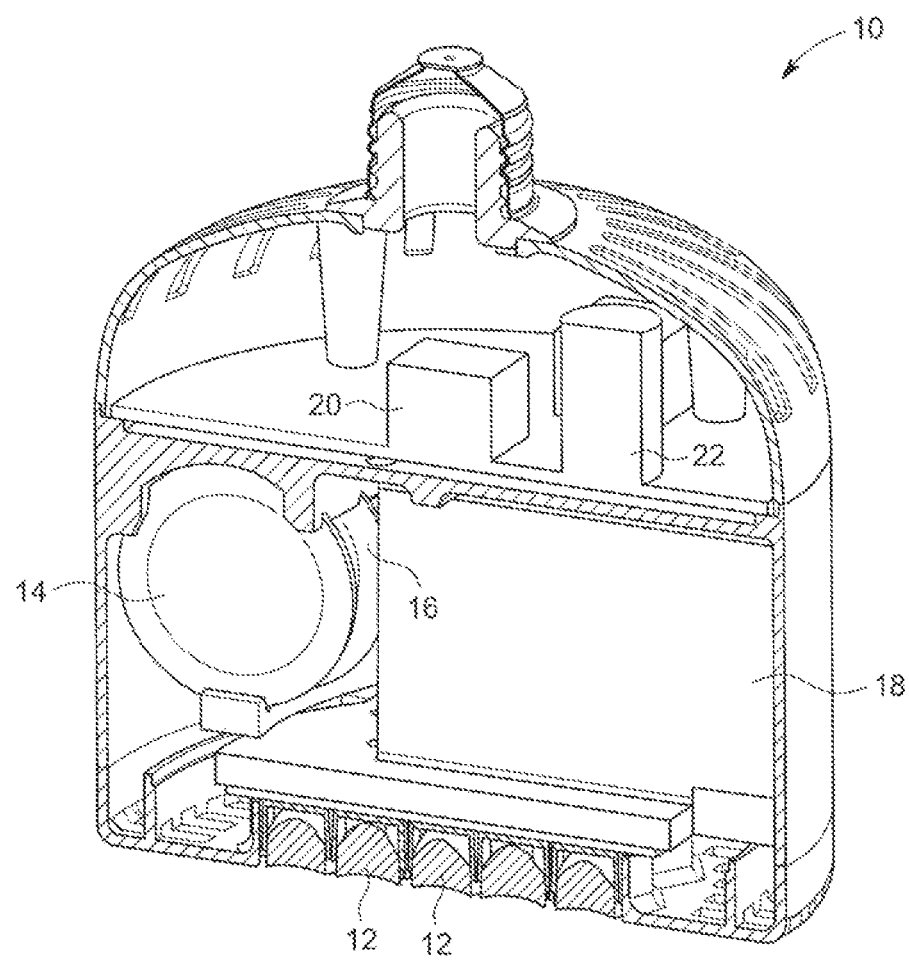
FIG. 1 illustrates a cutaway view of one example embodiment of a device (e.g., a LED lighting system), as may be cooled with synthetic jets adapted to reduce a level of acoustic noise produced by the synthetic jets in accordance with aspects of the present invention.

FIG. 1 illustrates a cutaway view of one example of a LED lighting system 10 embodying aspects of the present invention. LED lighting system 10 includes one or more light sources 12, wherein one or more of the light sources may be a solid state component, such as an LED-based light source made up of one or more light emitting diodes (LEDs). LED lighting system 10 may include two or more synthetic jets 14, 16 arranged to induce a flow of fluid (e.g., air), as may be effective to cool a heat sink 18 thermally coupled to heat-producing components of the lamp system, such as light sources 12 and/or various standard circuitry 20, 22 commonly used for operation of the lamp system, as will be readily understood by one skilled in the art. Elaborated description of such standard circuitry is not needed for purposes of understanding and/or practicing the present invention and thus the reader will be spared from such an unnecessary and burdensome description.

The inventors of the present invention have innovatively recognized that one can actuate one or more sets of synthetic jets 14, 16 with respective actuating signals having a phase difference between one another chosen to reduce acoustic noise produced by synthetic jets 14, 16. In one example embodiment, the phase difference may be substantially 180°. That is, the phase difference is equal to 180° but for standard tolerances or nominal deviations, as will be readily understood by one skilled in the art.

Figure 2:
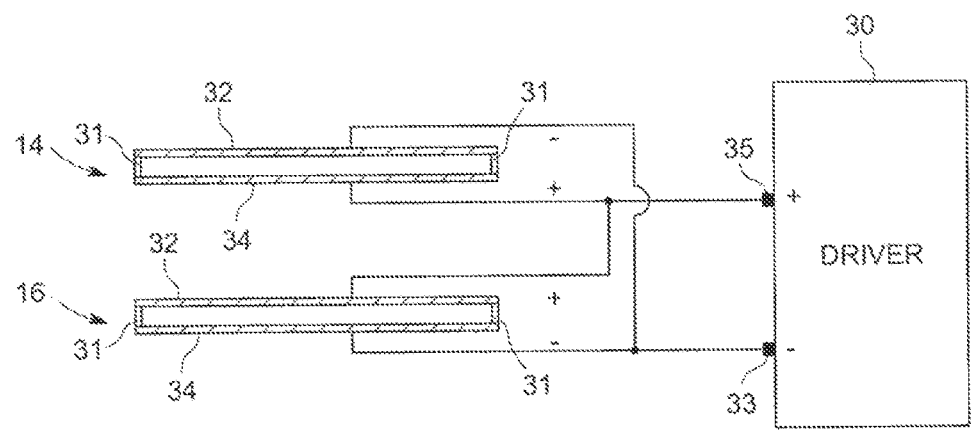
FIG. 2 illustrates a schematic representation of an example apparatus embodying aspects of the present invention for reducing acoustic noise in synthetic jets.
Figure 3:
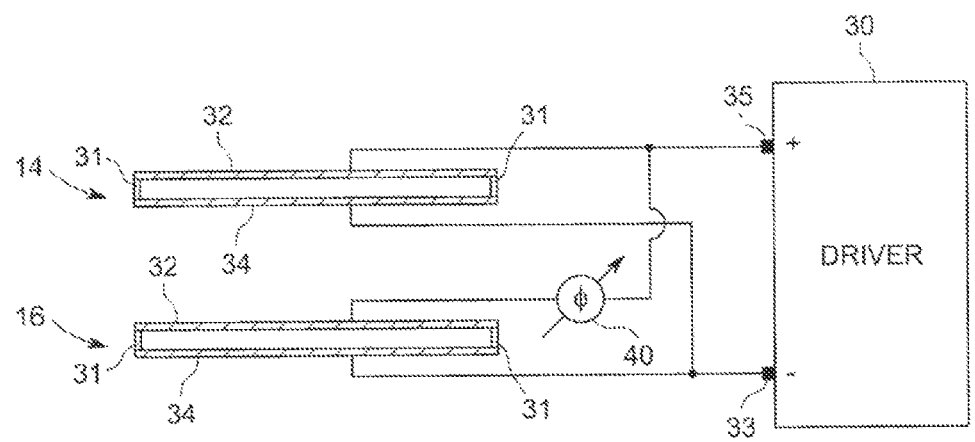
FIG. 3 illustrates a schematic representation of another example apparatus embodying aspects of the present invention for reducing acoustic noise in synthetic jets.

In one example embodiment, the 180° phase difference may be obtained by reversing (e.g., flipping) interconnecting leads from a driver 30, (e.g., signal generator and/or amplifier) as may be configured to supply a sinusoidal signal for actuating synthetic jets 14, 16 at a common frequency. The description below is based on example embodiments, as shown in FIGS. 2 and 3, where each synthetic jet 14, 16 may comprise a first actuator 32 and a second actuator 34 (e.g., a top piezoelectric disk 32 and a bottom piezoelectric disk 34) mechanically coupled to mutually opposing surfaces of an elastomeric wall 31. It will be appreciated by those skilled in the art that aspects of the present invention are not limited to any specific structural design of the synthetic jets, and consequently the foregoing embodiments should be construed in an example sense and not in a limiting sense. For readers desirous of general background information regarding additional examples of synthetic jets structures, reference is made to U.S. Pat. No. 7,688,583, which is assigned in common to the assignee of the present invention and is herein incorporated by reference.

In the example shown in FIG. 2, if first actuator 32 of synthetic jet 14 is connected to a first signal output terminal 33 of driver 30 (e.g., terminal labeled with a negative sign (−)), and second actuator 34 of synthetic jet 16 is also connected to first terminal 33 of driver 30; then second actuator 34 of synthetic jet 14 would be connected to a second signal output terminal 35 of driver 30 (terminal labeled with a positive sign (+)) and first actuator 32 of synthetic jet 16 would be connected to second terminal 35 of driver 30. Therefore, the electrical interconnections of the actuators may be arranged so that while one jet is ejecting cooling fluid, the second jet is ingesting cooling fluid to provide an out-of-phase operation, without any phase shifting electronics. It will be appreciated by one skilled in the art that in the context of alternating current (AC) signals, as supplied by driver 30, the positive sign and negative sign indications used above are not meant to indicate voltage polarity but are just example indicators for denoting an interconnecting arrangement for obtaining the out-of-phase relationship (180° phase difference) conducive to acoustic noise reduction, in lieu of a conventional in-phase relationship (0° phase difference), as commonly used in conventional interconnecting arrangements for the of synthetic jets.

It will be appreciated that the phase difference between the actuating signals for actuating synthetic jets 14, 16 need not be limited to 180°. It is contemplated that in some applications one could use an adjustable phase shifter 40, as illustrated in FIG. 3, for providing a selectable phase difference, which could be 180°, or any other phase difference value, as may be appropriate for a given application. For example, there may be certain applications where the spatial arrangement of synthetic jets 14, 16 and/or the acoustical properties of the surrounding structure may call for a phase difference value other than 180° to achieve an optimal noise reduction.

Figure 4:
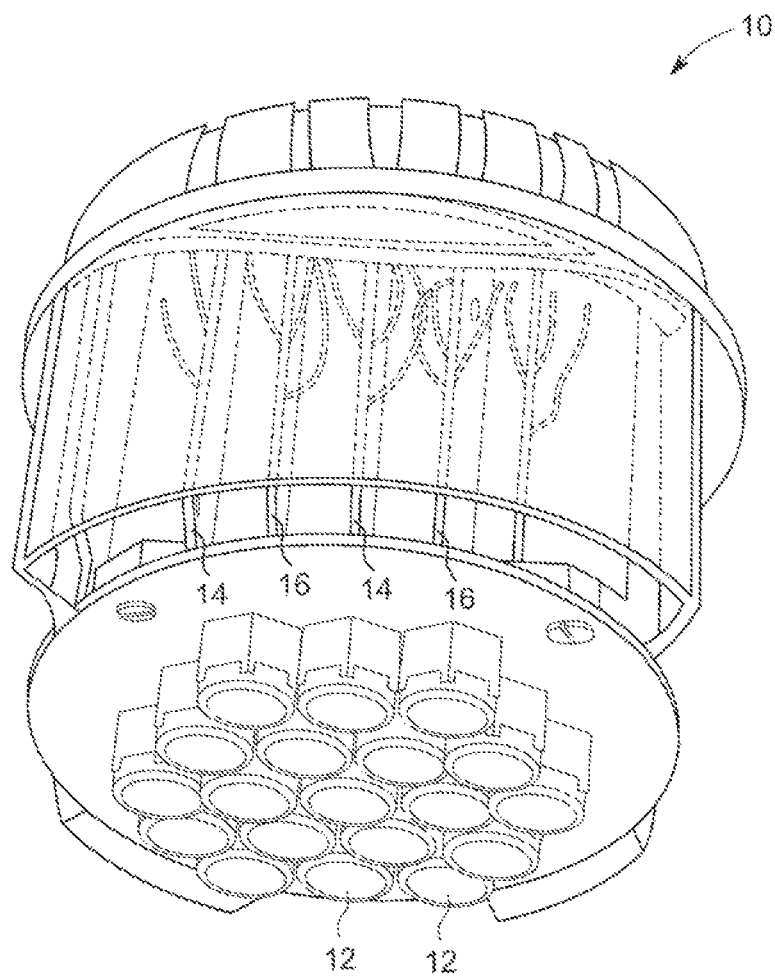
FIG. 4 illustrates an isometric view of a LED lighting system embodying aspects of the present invention.

FIG. 4 is an isometric view of LED lighting system 10 where additional sets of synthetic jets 14, 16, as may be used by the lighting system, are illustrated. In one example embodiment, each pair of adjacent synthetic jets is arranged to be responsive to respective actuating signals having the phase difference chosen to reduce acoustic noise, as described above (out-of-phase relationship). It will be appreciated that one need not be limited to an arrangement where every adjacent pair of synthetic jets is operated in such an out-of-phase relationship. For example, one has the flexibility to choose an arrangement where some pairs of adjacent synthetic jets operate in an out-of-phase relationship and some other pairs of adjacent synthetic jets operate in an in-phase relationship. It is noted that, although the example embodiments shown in FIGS. 1 and 4 illustrate sets of synthetic jets 14, 16 positioned substantially parallel to one another, aspects of the present invention are not limited to any specific positioning of the synthetic jets.

Figure 5:
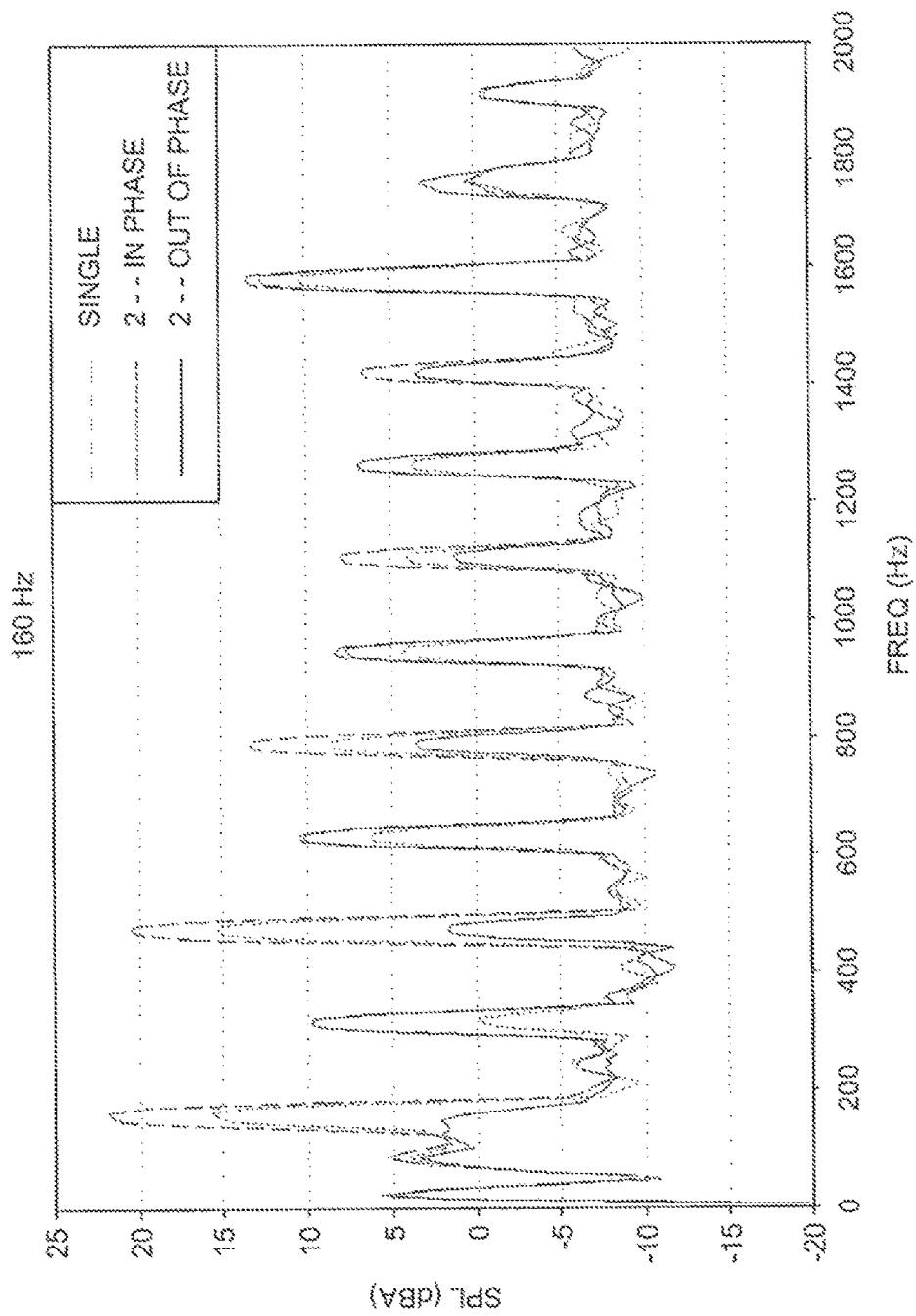
FIGS. 5-7 respectively illustrate plots of example comparative levels of acoustic noise under various example testing arrangements, as may be useful for comparatively illustrating example noise reduction achieved when using synthetic jets embodying aspects of the present invention.
Figure 6:
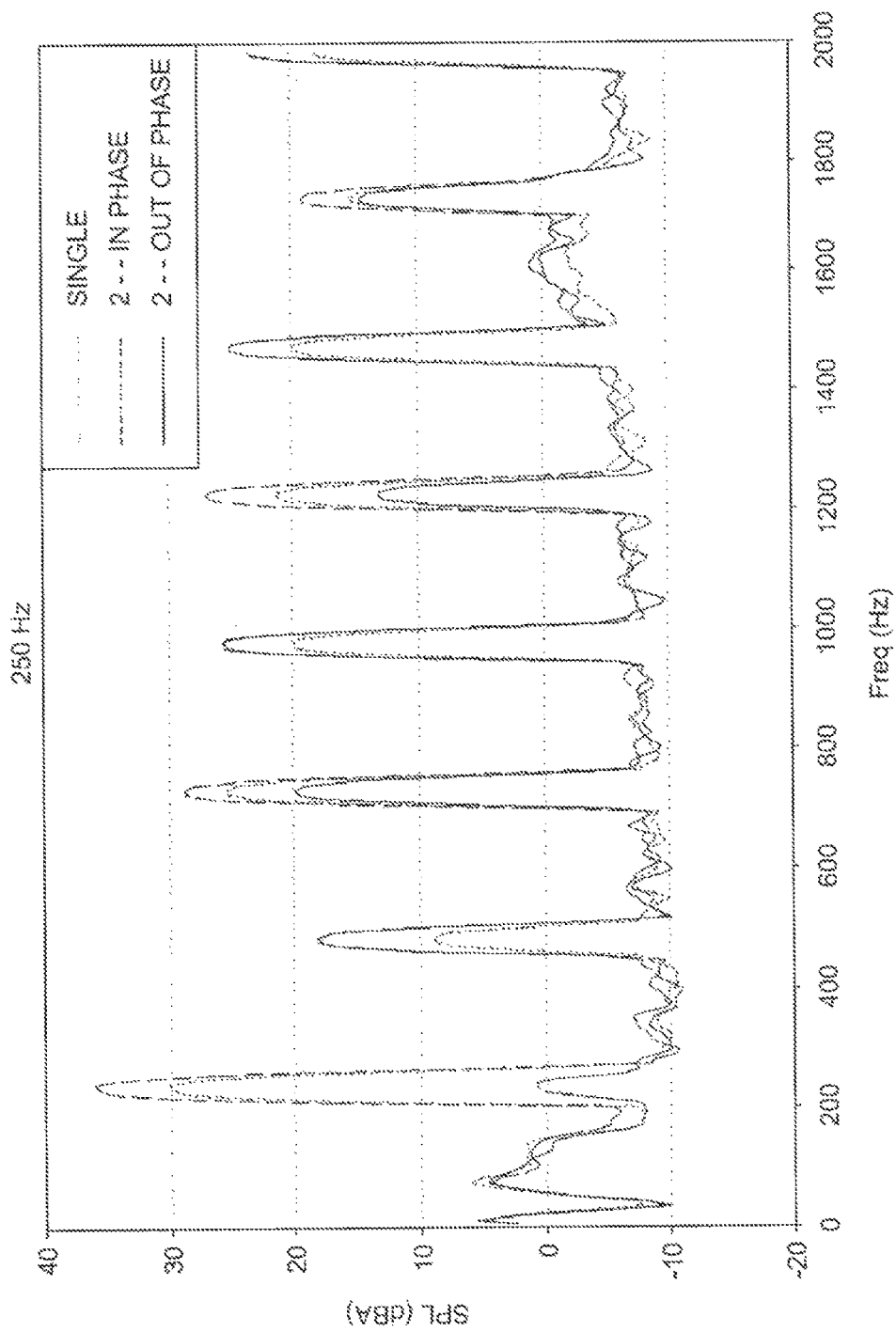
Figure 7:
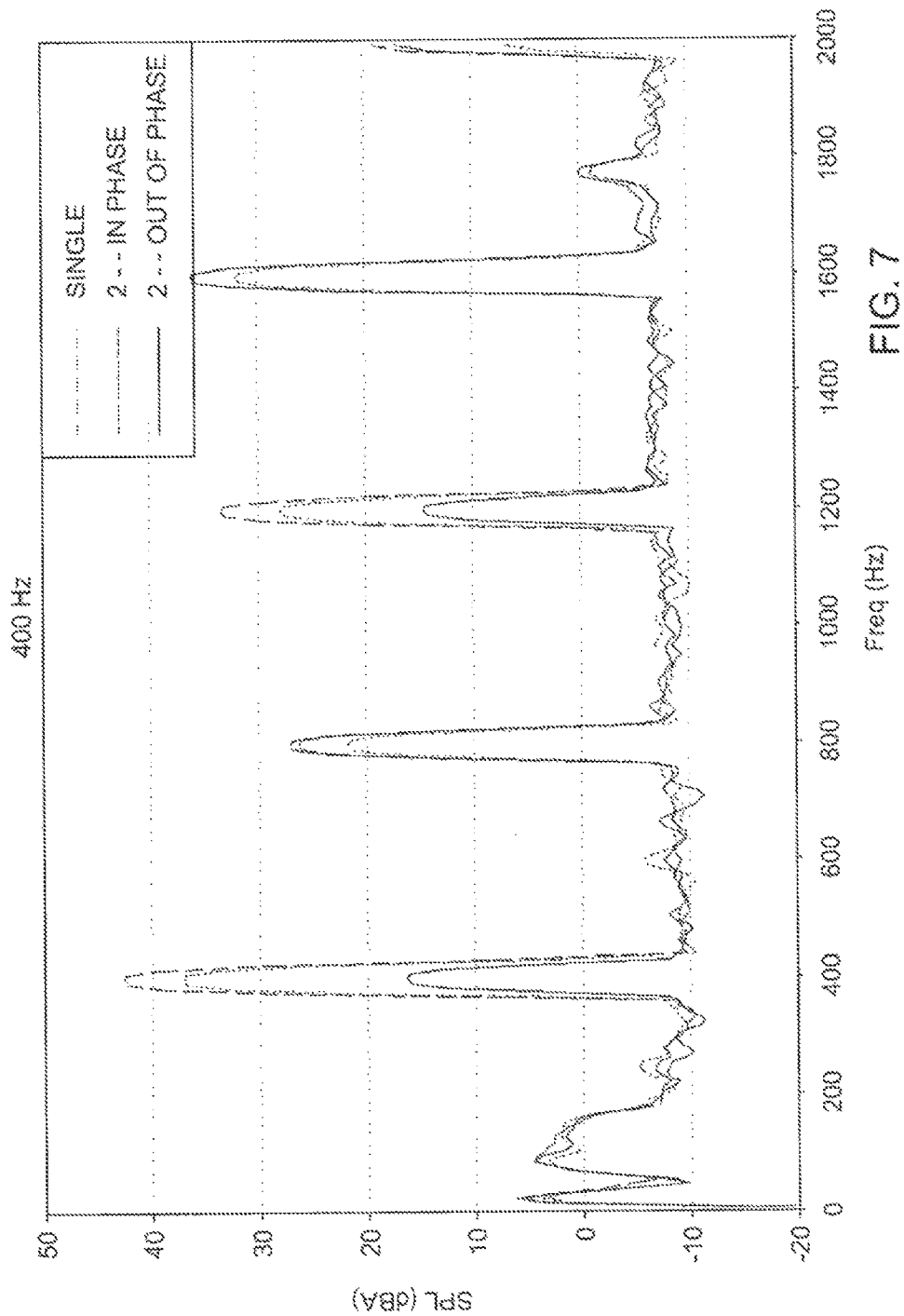

FIGS. 5-7 respectively illustrate plots of example comparative levels of acoustic noise for various example testing arrangements, as may be useful for comparatively illustrating example noise reduction when using synthetic jets embodying aspects of the present invention. Each of FIGS. 5-7 shows a respective example of a sound level frequency spectrum for: 1) a single jet; 2) an in-phase pair of jets; and 3) an out-of-phase pair of jets in accordance with aspects of the present invention. The plots shown in FIGS. 5-7 correspond to a frequency value of 160 Hz, 250 Hz and 400 Hz, respectively for the jet actuating signals. It is noted that in each example case, the peak noise level produced by a pair of out-phase jets in accordance with aspects of the present invention single jet is lower than the peak noise level of a single jet. The overall noise levels across the frequency spectrum for the various testing arrangements shown in FIGS. 5-7 are listed in the table below. It will be appreciated that the frequency values listed above represent example frequency values for the jet actuating signals. In one example embodiment, the frequency value may comprise a range from approximately 100 Hz to approximately 500 Hz.

TABLE

| | Noise Level (dB) | | |
|---|---|---|---|
| Single Jet | 26.1 | 39.0 | 44.8 |
| In-Phase Jets | 31.3 | 44.1 | 50.0 |
| Out-of-Phase Jets | 24.2 | 37.8 | 42.8 |
| Actuating Frequency | 160 Hz | 250 Hz | 400 Hz |

While various embodiments of the present invention have been shown and described herein, it will be understood that such embodiments are provided by way of example only. Numerous variations, changes and substitutions may be made without departing from the invention herein. Accordingly, it is intended that the invention be limited only by the spirit and scope of the appended claims.

What is claimed is:

1. An apparatus for reducing acoustical noise when cooling a device with synthetic jets, the apparatus comprising:
at least a set of a first synthetic jet and a second synthetic jet each comprising a first actuator and a second actuator; and
a driver coupled to the first and second actuators of the first and second synthetic jets and configured to output actuating signals to the first and second actuators of the first and second synthetic jets;
wherein the first and second actuators of the second synthetic jet are coupled to respective output terminals of the driver in a flipped relationship relative to the first and second actuators of the first synthetic jet such that the actuating signals received by the first and second synthetic jets have a 180° phase difference therebetween.

2. The apparatus of claim 1, wherein the first and second actuators of the first and second synthetic jets are piezoelectric disks.

3. The apparatus of claim 1, wherein the first synthetic jet comprises an elastomeric wall and the first and second actuators of the first synthetic jet are mechanically coupled to mutually opposing surfaces of the elastomeric wall of the first synthetic jet; and
wherein the second synthetic jet comprises an elastomeric wall and the first and second actuators of the second synthetic jet are mechanically coupled to mutually opposing surfaces of the elastomeric wall of the second synthetic jet.

4. The apparatus of claim 1, wherein the driver comprises:
a first signal output terminal coupled to the first actuator of the first synthetic jet and the second actuator of the second synthetic jet; and
a second signal output terminal coupled to the second actuator of the first synthetic jet and the first actuator of the second synthetic jet.

5. The apparatus of claim 1, wherein the first and second synthetic jets are positioned substantially parallel to one another.

6. The apparatus of claim 1, further comprising additional sets of synthetic jets, wherein each pair of adjacent synthetic jets is responsive to respective actuating signals having said phase difference.

7. The apparatus of claim 1, further comprising a set of a third synthetic jet and a fourth synthetic jet each comprising a first actuator and a second actuator;
wherein the driver is configured to output actuating signals to the first and second actuators of the third and fourth synthetic jets; and
wherein the first and second actuators of the third synthetic jet are coupled to respective output terminals of the driver in the same relationship relative to the first and second actuators of the fourth synthetic jet such that the actuating signals received by the third and fourth synthetic jets are in-phase with each other.

8. The apparatus of claim 1, wherein the device comprises a lamp system that emits light using a solid state component.

9. The apparatus of claim 8, wherein the solid state component comprises at least one light emitting diode.

10. The apparatus of claim 8, further comprising a heat sink thermally coupled to the solid state component, wherein the first and second synthetic jets are arranged to induce a flow of fluid to cool said heat sink and thereby remove at least some of an amount of thermal energy produced by the solid state component.

11. The apparatus of claim 1, wherein the respective actuating signals comprise sinusoidal signals having a common frequency value.

12. The apparatus of claim 11, wherein the common frequency value comprises a range from approximately 100 Hz to approximately 500 Hz.

13. A method for reducing acoustical noise when cooling a device with synthetic jets, said method comprising:
arranging at least a first synthetic jet and a second synthetic jet to induce a flow of fluid for cooling the device, wherein each of the first and second synthetic jets comprises a first actuator and a second actuator;
coupling the first and second actuators of the first and second synthetic jets to a driver such that the first and second actuators of the second synthetic jet are coupled to respective output terminals of the driver in a flipped relationship relative to the first and second actuators of the first synthetic jet and actuating signals received by the first and second synthetic jets have a 180° phase difference therebetween; and actuating the first and second synthetic jets with sinusoidal signals output from the output terminals of the driver.

14. The method of claim 13 further comprising:

arranging a third synthetic jet and a fourth synthetic jet to induce a flow of fluid for cooling the device, wherein each of the third synthetic jet and the fourth synthetic jet comprises a first actuator and a second actuator;

coupling the first and second actuators of the third and fourth synthetic jets to the driver such that the first and second actuators of the fourth synthetic jet are coupled to the output terminals of the driver in the same relationship relative to the first and second actuators of the third synthetic jet and actuating signals received by the third and fourth synthetic jets are in phase with each other; and actuating the third and fourth synthetic jets with sinusoidal signals output from the output terminals of the driver.

15. The method of claim 13 further comprising actuating the first and second synthetic jets with respective sinusoidal signals having a common frequency value.

16. A cooling system comprising:

at least a set of a first synthetic jet and a second synthetic jet;

a driver arranged to supply actuating signals to the first and second synthetic jets;

a phase shifter coupled between the driver and the second synthetic jet, the phase shifter configured to shift the phase of the actuating signals supplied by the driver to the second synthetic jet such that the actuating signals received by the first and second synthetic jets have a phase difference between one another chosen to reduce acoustic noise produced by the first and second synthetic jets; and a heat sink thermally coupled to at least one heat generating component, wherein the first and second synthetic jets are arranged to induce a flow of fluid to cool the heat sink.

17. The cooling system of claim 16 wherein the phase difference comprises a value of substantially 180°.

18. The cooling system of claim 16, wherein each of the first and second synthetic jets comprise first and second actuators; and wherein the first and second actuators of the first and second synthetic jets are coupled to respective output terminals of the driver.

19. The cooling system of claim 16, wherein the phase shifter is adjustable such that the phase difference between the actuating signals received by the first and second synthetic jets is selectable.

20. The cooling system of claim 16, wherein the first and second synthetic jets are positioned substantially parallel to one another.

21. The cooling system of claim 16, further comprising additional sets of synthetic jets, wherein each pair of adjacent synthetic jets operates in an out-of-phase relationship.

22. The cooling system of claim 16, further comprising a set of a third synthetic jet and a fourth synthetic jet;

wherein the driver is arranged to supply actuating signals to the third and fourth synthetic jets absent a phase shifter such that the actuating signals received by the third and fourth synthetic jets are in-phase with each other.

23. The cooling system of claim 16, wherein the heat generating component comprises at least one light emitting diode.

24. The cooling system of claim 16, wherein the actuating signals comprise sinusoidal signals having a common frequency value.

25. The cooling system of claim 24, wherein the frequency value comprises a range from approximately 100 Hz to approximately 500 Hz.

26. The cooling system of claim 16 wherein the first and second synthetic jets are arranged in front of the heat sink such that an air gap is formed between the first and second synthetic jets and a front plane of the heat sink.

27. The apparatus of claim 10, further comprising a synthetic jet mounting structure mounted independent from the heat sink; and wherein the first synthetic jet and the second synthetic jet are mounted within the synthetic jet mounting structure.

28. The apparatus of claim 18, wherein the phase shifter is coupled between the driver and the first actuator of the second synthetic jet.

29. The apparatus of claim 18, wherein the first synthetic jet comprises an elastomeric wall and the first and second actuators of the first synthetic jet are mechanically coupled to mutually opposing surfaces of the elastomeric wall of the first synthetic jet;

wherein the second synthetic jet comprises an elastomeric wall and the first and second actuators of the second synthetic jet are mechanically coupled to mutually opposing surfaces of the elastomeric wall of the second synthetic jet.

30. The apparatus of claim 10, wherein the first and second synthetic jets are mounted free of contact with the heat sink.

* * * * *